United States Patent
Delucco

(10) Patent No.: US 9,783,099 B1
(45) Date of Patent: Oct. 10, 2017

(54) WIRING CONNECTOR AND TAIL LIGHT ASSEMBLY WITH GROUND FAULT INDICATOR

(71) Applicant: HOPKINS MANUFACTURING CORPORATION, Emporia, KS (US)

(72) Inventor: Damien Anthony Delucco, Wamego, KS (US)

(73) Assignee: Hopkins Manufacturing Corporation, Emporia, KS (US)

( * ) Notice: Subject to any disclaimer, the term of this patent is extended or adjusted under 35 U.S.C. 154(b) by 0 days.

(21) Appl. No.: 15/162,251

(22) Filed: May 23, 2016

Related U.S. Application Data

(60) Provisional application No. 62/287,674, filed on Jan. 27, 2016.

(51) Int. Cl.
*G08B 21/00* (2006.01)
*B60Q 1/30* (2006.01)
*B60Q 1/00* (2006.01)
*B60Q 11/00* (2006.01)

(52) U.S. Cl.
CPC .......... *B60Q 1/305* (2013.01); *B60Q 1/0088* (2013.01); *B60Q 11/005* (2013.01)

(58) Field of Classification Search
None
See application file for complete search history.

(56) References Cited

U.S. PATENT DOCUMENTS

| 4,866,390 A | * | 9/1989 | Butchko | B60Q 11/00 324/133 |
| 6,081,189 A | * | 6/2000 | Warner | B60Q 11/007 324/504 |
| 2015/0137961 A1 | * | 5/2015 | Bean | B60Q 11/005 340/431 |
| 2015/0306928 A1 | * | 10/2015 | McCollum | B60T 13/662 340/431 |

* cited by examiner

*Primary Examiner* — Julie Lieu
(74) *Attorney, Agent, or Firm* — Hovey Williams LLP

(57) ABSTRACT

A connector for connecting wiring of a towed vehicle lighting system to wiring of a towing vehicle lighting system so that lights on the towed vehicle are activated when corresponding lights on the towing vehicle are activated. The connector includes a plurality of terminals for connecting to the wiring of the towed vehicle and configured for coupling with terminals on a mating connector on the towing vehicle; a ground terminal for connecting to a ground wire on the towed vehicle and configured for coupling with a ground terminal on the mating connector on the towing vehicle; ground fault detection circuitry for detecting when the connector is not properly grounded to the towed vehicle; and an indicator coupled with the ground fault detection circuitry for indicating when the connector is not properly grounded to the towed vehicle.

20 Claims, 2 Drawing Sheets

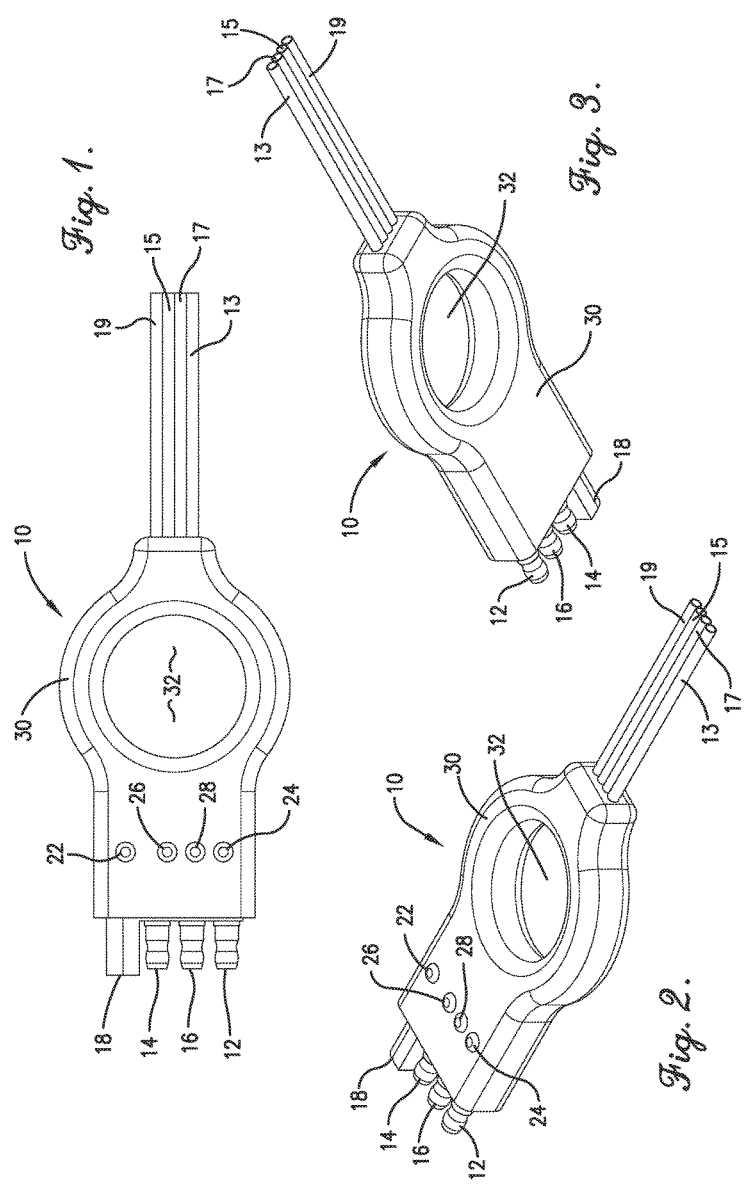

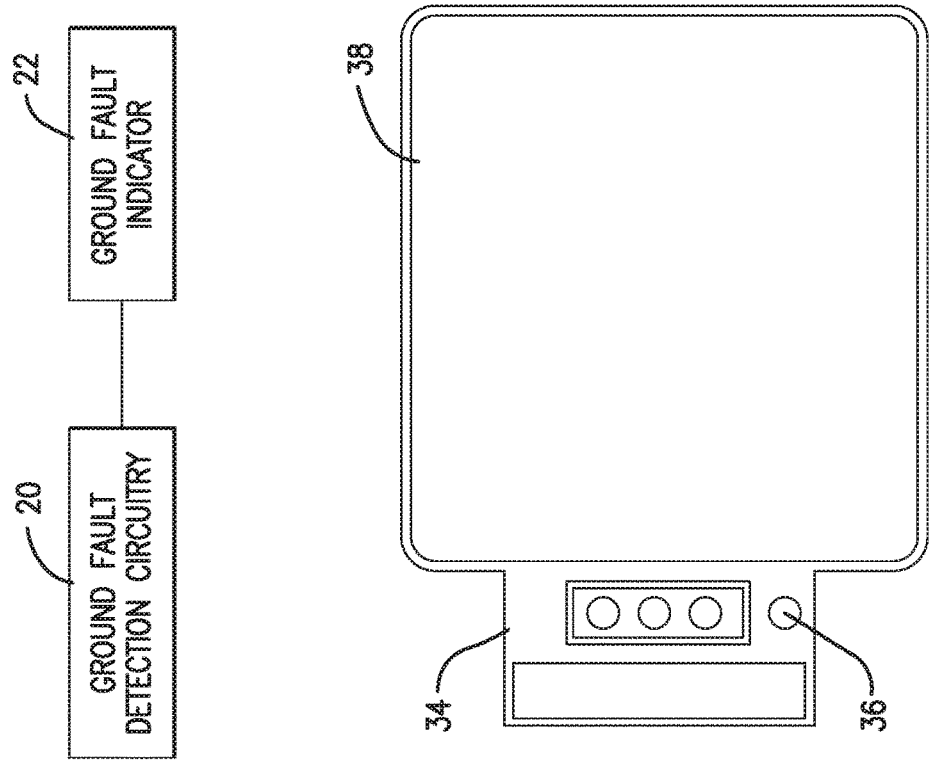

WIRING CONNECTOR AND TAIL LIGHT ASSEMBLY WITH GROUND FAULT INDICATOR

RELATED APPLICATION

This patent application claims priority benefit with regard to all common subject matter, of U.S. Provisional Patent Application No. 62/287,674, filed Jan. 27, 2016, and entitled "TRAILER WIRING CONNECTOR AND TAIL LIGHT ASSEMBLY WITH GROUND FAULT INDICATOR" which is hereby incorporated by reference in its entirety into the present application.

BACKGROUND

Wiring connectors are often used to interconnect the lighting system wiring of a towing vehicle such as a truck to the lighting system wiring of a towed vehicle such as a boat trailer so that the turn signals, tail lights, and/or other lights on the towed vehicle are activated at the same time as the corresponding lights on the towing vehicle. For safety and proper operation, such connectors should always be grounded. Most connectors therefore have a ground terminal that is connected to a ground wire that is in turn bolted or otherwise electrically connected to a metal surface on the towed vehicle to provide such grounding. The ground terminal on the wiring connector plugs into a corresponding ground terminal on a mating wiring connector on the towing vehicle which is in turn connected to a ground wire that is bolted or otherwise electrically connected to a metal surface on the towing vehicle so as to ground the towing vehicle side of the wiring.

Improper ground connections are the most common cause of lighting problems in trailers and other towed vehicles. Grounding problems often occur when users simply fail to connect trailer ground wires to a ground source and/or when ground connections become loose or otherwise faulty over time due to vibration, rust, or debris buildup around the connections. Even though grounding problems are the chief cause of lighting connection problems in towed vehicles, many users don't recognize this, and instead improperly assume trailer wiring connectors are defective or broken when the lighting system on a towed vehicle doesn't work properly. Moreover, even when users suspect a grounding problem, poor or non-existent ground connections are sometimes difficult to locate and fix.

SUMMARY

The present invention solves the above-described problems by providing a more convenient and accurate way to diagnose a faulty ground connection on a towed vehicle.

One embodiment of the invention is a trailer wiring connector with circuitry that detects a faulty or non-existent ground connection and an integral LED light or other ground fault indicator that indicates the grounding problem. The ground fault indicator may be activated in any manner to indicate a faulty ground. For example, the ground fault indicator may illuminate or blink when the ground connection is faulty, may illuminate or blink when the ground connection is good, or may emit one color, such as green, when the ground connection is good, and another color, such as red, when the ground connection is faulty.

In another embodiment of the invention, a ground fault indicator circuit is integrated into a tail light assembly configured to be installed on a trailer or other towed vehicle. The ground fault indicator circuit has an LED light or other ground fault indicator that indicates if the trailer light assembly is not properly grounded as described above. This permits a user to quickly locate a ground problem with the tail light assembly itself.

In yet another embodiment of the invention, the above described trailer wiring connector and tail light assembly are provided in combination so that both the trailer wiring connector and the tail light assembly indicate the status of a ground connection. This allows a user to pinpoint the precise location of a ground fault. For example, if the indicator on the trailer wiring connector indicates a faulty ground connection, the user knows to check the ground wire between the connector and the trailer and/or the ground wire on the towing vehicle side of the connector. But if the indicator on the tail light assembly indicates a faulty ground connection, the user knows to check the wiring in or adjacent to the tail light assembly.

This summary is provided to introduce a selection of concepts in a simplified form that are further described in the detailed description below. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein:

FIG. 1 is a top plan view of a trailer wiring connector constructed in accordance with an embodiment of the present invention.

FIG. 2 is a top perspective view of the trailer wiring connector of FIG. 1.

FIG. 3 is a bottom perspective view of the trailer wiring connector of FIG. 1.

FIG. 4 is a block diagram of selected electronic components of the trailer wiring connector of FIG. 1.

FIG. 5 is a schematic view of a tail light assembly constructed in accordance with another embodiment of the present invention.

The drawing figures do not limit the present invention to the specific embodiments disclosed and described herein. The drawings are not necessarily to scale, emphasis instead being placed upon clearly illustrating the principles of the invention.

DETAILED DESCRIPTION

The following detailed description of embodiments of the invention references the accompanying drawings. The embodiments are intended to describe aspects of the invention in sufficient detail to enable those skilled in the art to practice the invention. Other embodiments can be utilized and changes can be made without departing from the scope of the claims. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Turning now to the drawing figures and initially FIG. 1, a wiring connector 10 constructed in accordance with a first embodiment of the invention is illustrated. The wiring connector is configured to be connected to the lighting system wiring on a trailer, boat, camper, or any other towed vehicle and mates with a corresponding connector on a truck, car, or other towing vehicle so as to interconnect the towed vehicle lighting system with the towing vehicle lighting system. The illustrated connector 10 is a 4-way flat connector that is configured for coupling with a mating 4-way flat connector on a towing vehicle. However, the connector 10 may instead be a 5-way flat connector, a 7-blade connector, a 6-way round type connector, or any other style of connecter, as the particular shape and configuration of the connector is not important to the present invention.

The illustrated embodiment of the connector 10 has a terminal 12 connected to wire(s) 13 to be connected to the towed vehicle's right turn light assembly, a terminal 14 connected to wire(s) 15 connected to the towed vehicle's left turn light assembly, a terminal 16 connected to wire(s) 17 connected to the towed vehicle's tail light assembly (which may be the towed vehicle's left and right turn light assemblies), and a ground terminal 18 connected to wire(s) 19 to be connected to a ground source on the trailer. The connector 10 may be provided with any number of terminals, and the terminals may be oriented in any way, without departing from the scope of the invention.

As illustrated in FIG. 4, the connector 10 also has ground fault detection circuitry 20 that detects when it is not properly grounded and a ground fault indicator 22 for displaying the status of the ground connection. In one embodiment, the ground fault detection circuitry uses power from any or all of the terminals 12, 14, 16 to determine if a ground fault exists. For example, if a signal is present on any of the terminals 12, 14, 16, the wiring to the taillights and the ground wiring is not faulty, and the taillight bulbs themselves are operating properly, ground fault detection circuitry activates the indicator 20 to indicate that the trailer grounding is good.

The ground fault detection circuitry detects the presence or absence of a ground fault by detecting the voltage difference between vehicle ground and trailer ground. To accomplish this, the ground fault detection circuitry includes a diode in series with both grounds and circuitry for measuring voltage across the diode. The ground fault detection circuitry measures voltage across the diode to detect the presence or absence of a trailer ground. In one embodiment, no ground fault is detected when the voltage difference between towing vehicle ground and towed vehicle ground is greater than approximately 350 mv. A ground fault is determined when voltage is less than 250 mv.

The ground fault indicator 22 may be any device that can indicate the presence or absence of a ground fault. For example, the indicator may be a visual indicator such as an LED light; an audible indicator such as a beeper, bell, or speaker; or a combination audible/visual alarm. In a preferred embodiment, the ground fault indicator is an LED located adjacent the ground terminal 18 as shown in FIGS. 1 and 2. The ground fault detection circuitry 20 may activate the ground fault indicator 22 in any manner to indicate a faulty ground. For example, the ground fault detection circuitry 20 may light up or blink the LED when the ground connection is faulty, may light up or blink the LED 22 when the ground connection is good, or may light up the LED in one color, such as green, when the ground connection is good, and another color, such as red, when the ground connection is faulty.

The connector 10 may also include LEDs or other indicators 24, 26, 28 indicate wiring continuity between the terminals 12, 14, 16 and the corresponding terminals on the mating connector on a towing vehicle. For example, the LED 22 for the terminal 12 may turn on, blink, or change color if a signal is present on the terminal 12, thus indicating the right turn signal of the towing vehicle has been activated and the corresponding right turn signal on the towed vehicle should also be activated. If the LED 24 is illuminated after the right turn signal of the towing vehicle has been activated, but the right turn signal lamp on the towed vehicle doesn't activate, then the operator knows to replace or otherwise check the bulb in the towed vehicle right turn signal lamp. If the LED 24 does not illuminate after the right turn signal of the towing vehicle is activated, then the operator knows a faulty connection exists between the connector 10 and the mating connector on the towing vehicle and/or one of the connectors or the corresponding wiring is defective or damaged.

In one embodiment of the connector 10, the wires and circuitry of the connector are molded into a housing 30 having a central circular opening 32. A user may insert one or more fingers into the opening when attaching or detaching the connector to or from a mating connector. The opening allows the user to more securely grip the connector and connect it to or remove it from a mating connector without twisting it or moving it side-to-side and placing stress on the wires and terminals 12-18.

FIG. 5 illustrates another embodiment of the invention in which a ground fault detection circuit 34 and a ground fault indicator 36 are integrated into a trailer tail light assembly 38. The ground fault detection circuit 34 and indicator 36 indicate if the trailer light assembly 38 is properly grounded. Using power from signals that are presented to the trailer light assembly, the ground fault detection circuit 34 causes the indicator 36 to illuminate, blink, change colors, or turn off when a tail light ground fault is detected. For example, if either a turn signal or a brake signal is present at the circuit and the tail light bulbs themselves are working properly, the indicator will illuminate, blink, or turn-off when a ground fault is detected. The trailer tail light operates by having either the brake/turn signal or the running lights activated via the towing vehicle. Using the trailer signal that is inactive, a means of detecting whether or not the tail light assembly has an adequate ground is accomplished. In one embodiment, a simple transistor circuit is used to do the detection. No ground fault is detected when the transistor is saturated. A ground fault is detected if the transistor is not saturated.

In yet another embodiment of the invention, the above described trailer wiring connector 10 and tail light assembly 38 are provided in combination so that both the trailer wiring connector and the tail light assembly indicate the status of a ground connection. This allows a user to pinpoint the precise location of a ground fault. For example, if the indicator on the trailer wiring connector indicates a faulty ground connection, the user knows to check the ground wire between the connector and the trailer. But if the indicator on the tail light assembly indicates a faulty ground connection, the user knows to check the wiring in or adjacent to the tail light assembly.

Although the invention has been described with reference to the preferred embodiment illustrated in the attached drawing figures, it is noted that equivalents may be employed and substitutions made herein without departing from the scope of the invention as recited in the claims.

Having thus described the preferred embodiment of the invention, what is claimed as new and desired to be protected by Letters Patent includes the following:

1. A connector for connecting wiring of a towed vehicle lighting system to wiring of a towing vehicle lighting system so that lights on the towed vehicle are activated when corresponding lights on the towing vehicle are activated, the connector comprising:
   a plurality of terminals for connecting to the wiring of the towed vehicle lighting system and configured for coupling with terminals on a mating connector on the towing vehicle;
   a ground terminal for connecting to a ground wire on the towed vehicle and configured for coupling with a ground terminal on the mating connector on the towing vehicle;
   ground fault detection circuitry for detecting when the connector is not properly grounded to the towed vehicle; and
   an indicator coupled with the ground fault detection circuitry for indicating when the connector is not properly grounded to the towed vehicle.

2. The connector as set forth in claim 1, wherein the indicator is selected from the group consisting of a visual indicator, an audible indicator, an audible and visual indicator, and a vibration indicator.

3. The connector as set forth in claim 1, wherein the indicator is an LED.

4. The connector as set forth in claim 3, wherein the ground fault detection circuitry illuminates the LED if it detects the connector is not properly grounded to the towed vehicle.

5. The connector as set forth in claim 3, wherein the ground fault detection circuitry illuminates the LED if it detects the connector is properly grounded to the towed vehicle.

6. The connector as set forth in claim 3, wherein the ground fault detection circuitry changes a color of the LED if it detects the connector is not properly grounded to the towed vehicle.

7. The connector as set forth in claim 3, wherein the ground fault detection circuitry changes a color of the LED if it detects the connector is properly grounded to the towed vehicle.

8. The connector as set forth in claim 1, wherein the ground fault detection circuitry includes a diode in series with the ground terminal and circuitry that measures voltage across the diode to detect presence or absence of a ground connection.

9. The connector as set forth in claim 1, further comprising an LED coupled with each terminal for indicating wiring continuity between each terminal and a corresponding terminal on the mating connector on the towing vehicle.

10. A four-way flat connector for connecting wiring of a towed vehicle lighting system to wiring of a towing vehicle lighting system so that lights on the towed vehicle are activated when corresponding lights on the towing vehicle are activated, the connector comprising:
    a housing having a central aperture through which a user may place one or more fingers to facilitating coupling and uncoupling of the connector with a mating connector on the towing vehicle;
    three terminals partially embedded in one end of the housing for connecting to the wiring of the towed vehicle and for coupling with corresponding terminals on the mating connector on the towing vehicle;
    an LED coupled with each terminal for indicating wiring continuity between each terminal and a corresponding terminal on the mating connector on the towing vehicle;
    a ground terminal partially embedded in the one end of the housing for connecting to a ground wire on the towed vehicle and configured for coupling with a ground terminal on the mating connector on the towing vehicle;
    ground fault detection circuitry for detecting when the connector is not properly grounded to the towed vehicle; and
    an LED coupled with the ground fault detection circuitry for indicating when the connector is not properly grounded to the towed vehicle, wherein the ground fault detection circuitry changes a state of the LED if it detects the connector is not properly grounded to the towed vehicle.

11. The four-way flat connector as set forth in claim 10, wherein the ground fault detection circuitry illuminates the LED if it detects the connector is not properly grounded to the towed vehicle.

12. The four-way flat connector as set forth in claim 10, wherein the ground fault detection circuitry illuminates the LED if it detects the connector is properly grounded to the towed vehicle.

13. The four-way flat connector as set forth in claim 10, wherein the ground fault detection circuitry changes a color of the LED if it detects the connector is not properly grounded to the towed vehicle.

14. The four-way flat connector as set forth in claim 10, wherein the ground fault detection circuitry changes a color of the LED if it detects the connector is properly grounded to the towed vehicle.

15. The four-way flat connector as set forth in claim 10, wherein the ground fault detection circuitry includes a diode in series with the ground terminal and circuitry that measures voltage across the diode to detect presence or absence of a ground connection.

16. The four-way flat connector as set forth in claim 10, further comprising an LED coupled with each terminal for indicating wiring continuity between each terminal and a corresponding terminal on the mating connector on the towing vehicle.

17. A tail light assembly for a towed vehicle, the tail light assembly comprising:
    at least one terminal that receives an electrical signal from a towing vehicle;
    a lamp that is illuminated in response to the electrical signal from the towing vehicle;
    a ground connection for connecting to a ground wire;
    ground fault detection circuitry for detecting when the tail light assembly is not properly grounded to the towed vehicle; and
    an indicator coupled with the ground fault detection circuitry for indicating when the tail light assembly is not properly grounded to the towed vehicle.

18. The tail light assembly as set forth in claim 17, wherein the indicator is selected from the group consisting of a visual indicator, an audible indicator, an audible and visual indicator, and a vibration indicator.

19. The tail light assembly as set forth in claim 17, wherein the indicator is an LED.

20. The tail light assembly as set forth in claim 17, wherein the ground fault detection circuitry illuminates the LED if it detects the connector is not properly grounded to the towed vehicle.

\* \* \* \* \*